United States Patent
Xiao et al.

(10) Patent No.: US 12,006,263 B2
(45) Date of Patent: Jun. 11, 2024

(54) PREPARATION METHOD AND USE OF GREEN FLUORESCENT TRANSPARENT CERAMIC

(71) Applicant: ZHEJIANG UNIVERSITY, Hangzhou (CN)

(72) Inventors: Wenge Xiao, Hangzhou (CN); Jianrong Qiu, Hangzhou (CN); Xiaofeng Liu, Hangzhou (CN); Dezhi Tan, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 514 days.

(21) Appl. No.: 17/421,007

(22) PCT Filed: May 31, 2019

(86) PCT No.: PCT/CN2019/089463
§ 371 (c)(1),
(2) Date: Jul. 6, 2021

(87) PCT Pub. No.: WO2020/228066
PCT Pub. Date: Nov. 19, 2020

(65) Prior Publication Data
US 2022/0098113 A1   Mar. 31, 2022

(30) Foreign Application Priority Data

May 15, 2019   (CN) .......................... 201910400899.9

(51) Int. Cl.
*C04B 35/22* (2006.01)
*C04B 35/00* (2006.01)
(Continued)

(52) U.S. Cl.
CPC .............. *C04B 35/22* (2013.01); *C04B 35/00* (2013.01); *C09K 11/00* (2013.01);
(Continued)

(58) Field of Classification Search
CPC .......... C09K 11/7778; C09K 11/77744; C09K 11/7768; C09K 11/00; C04B 35/22;
(Continued)

(56) References Cited

FOREIGN PATENT DOCUMENTS

CN    106518037 A  *  3/2017  ............. C04B 35/22

OTHER PUBLICATIONS

CN-106518037-A English translation (Year: 2017).*

* cited by examiner

*Primary Examiner* — Anita Nassiri-Motlagh
(74) *Attorney, Agent, or Firm* — Bayramoglu Law Offices LLC

(57) ABSTRACT

A preparation method and use of a green fluorescent transparent ceramic are disclosed. The preparation method includes: weighing, according to a stoichiometric ratio, elements present in $Ca_{3-x-y}Ce_xA_ySc_{2-z}B_zSi_{3-m}C_mO_{12}$, in forms of oxides, carbonates or nitrates as raw materials; mixing the raw materials, annealing, melting at a high temperature, cooling and annealing at a low temperature; putting the glass into a high-temperature furnace, holding, raising the temperature, and performing crystallization and densification sintering; finally cutting, reducing and surface-polishing, where A is at least one from the group consisting of Lu, Y, Gd, La and Na; B is at least one from the group consisting of Zr, Hf and Mg; C is at least one from the group consisting of Al and P; x, y, z and m satisfy $0.001 \le x \le 0.06$, $0 \le y \le 0.06$, $0 \le z \le 0.06$ and $0 \le m \le 0.3$, respectively.

10 Claims, 4 Drawing Sheets

(51) Int. Cl.
*C09K 11/00* (2006.01)
*C09K 11/77* (2006.01)
*H01L 33/50* (2010.01)

(52) U.S. Cl.
CPC .... *C09K 11/7768* (2013.01); *C09K 11/77744* (2021.01); *C09K 11/7778* (2013.01); *H01L 33/502* (2013.01); *C04B 2235/00* (2013.01); *C04B 2235/3217* (2013.01); *C04B 2235/3225* (2013.01); *C04B 2235/3227* (2013.01); *C04B 2235/3229* (2013.01); *C04B 2235/3244* (2013.01); *C04B 2235/447* (2013.01); *C04B 2235/9653* (2013.01)

(58) Field of Classification Search
CPC ............ C04B 35/00; C04B 2235/9653; C04B 2235/447; C04B 2235/3244; C04B 2235/3229; C04B 2235/3227; C04B 2235/3225; C04B 2235/3217; C04B 2235/00
USPC .................................................. 252/301.4 R
See application file for complete search history.

PREPARATION METHOD AND USE OF GREEN FLUORESCENT TRANSPARENT CERAMIC

CROSS REFERENCE TO THE RELATED APPLICATIONS

This application is the national phase entry of International Application No. PCT/CN2019/089463, filed on May 31, 2019, which is based upon and claims priority to Chinese Patent Application No. 201910400899.9, filed on May 15, 2019, the entire contents of which are incorporated herein by reference.

TECHNICAL FIELD

The present invention belongs to the technical field of luminescent materials, and specifically relates to a preparation method and use of a green fluorescent transparent ceramic.

BACKGROUND

Light-emitting diode (LED) is considered to be the fourth-generation lighting source that is expected to replace traditional lighting due to its advantages of energy saving, environmental friendliness, long service life, small size and full solid state. With the continuous development and maturity of the white LED and people's demand for high-quality lighting, semiconductor solid-state lighting (SSL) is developing towards high stability, high optical quality and high excitation density. The high-power SSL source based on a high-power blue LED chip or a blue laser diodes (LD) imposes higher requirements on the physical and chemical stability and temperature characteristics of the phosphor conversion material used. Phosphor conversion materials (block), such as fluorescent transparent ceramics (US20090105065 and US20080138919) and fluorescent glass ceramics (CN103964691B and CN103395997B), feature excellent physical and chemical stability, high thermal conductivity and adjustable visible light transmittance, and are expected to replace the traditional "phosphor+organic material". Moreover, they are expected to be better used for high-power lighting and display because of their dual functions of phosphor conversion and packaging.

Fluorescent transparent ceramic has excellent mechanical properties and good thermal conductivity, which are conducive to diffuse the heat and improve the stability of the device. The preparation process of the fluorescent transparent ceramic is controlled to precisely adjust the scattering of visible light by the fluorescent transparent ceramic and optimize the scattering, transmission and absorption of light by the fluorescent converter, thereby obtaining a high-quality white LED or a fully converted monochromatic LED. In addition, compared with the "phosphor+organic material", the fluorescent transparent ceramic has much lower light scattering, so the required activator doping concentration can be lowered by an order of magnitude, and the internal quantum efficiency (IQE) and temperature characteristics are better. At present, the fluorescent transparent ceramics that can be used in semiconductor SSL are essentially composed of rare earth aluminate ($Re_3Al_5O_{12}$) with a garnet structure, and they are synthesized under high pressure, high temperature (>1,650° C.) and high vacuum, by a complex process at substantial expense.

The silicate garnet green phosphor $Ca_3Sc_2Si_3O_{12}$: $Ce^{3+}$ (Journal of The Electrochemical Society, 2007, 154(1): J35-J38.) has high IQE and excellent thermal stability. Chinese patent 201610957170.8 discloses a $Ca_3Sc_2Si_3O_{12}$-based full-spectrum fluorescent ceramic converter prepared by a conventional high-pressure, high-temperature and high-vacuum sintering method. The ceramic converter has a complicated sintering process, low density (≤98%) and serious light scattering, which limits its use in high-power lighting and display.

SUMMARY

In order to overcome the shortcomings in the prior art, an objective of the present invention is to provide a preparation method of a green fluorescent transparent ceramic. The method can prepare a green fluorescent transparent ceramic with high density and adjustable transmittance without high pressure and high vacuum.

The present invention provides a preparation method of a green fluorescent transparent ceramic.

First, the green fluorescent transparent ceramic is:

prepared according to a stoichiometric ratio of elements present in $Ca_{3-x-y}Ce_xA_ySc_{2-z}B_zSi_{3-m}C_mO_{12}$, where A is at least one, and may be a mixture of two or more of the group consisting of Lu, Y, Gd, La and Na; B is at least one selected from the group consisting of Zr, Hf and Mg; C is at least one selected from the group consisting of Al and P; x, y, z and m satisfy $0.001 \leq x \leq 0.06$, $0 \leq y \leq 0.06$, $0 \leq z \leq 0.06$ and $0 \leq m \leq 0.3$, respectively.

Second, the preparation method of the green fluorescent transparent ceramic includes the following steps:

(1) weighing, according to the stoichiometric ratio, the elements present in $Ca_{3-x-y}Ce_xA_ySc_{2-z}B_zSi_{3-m}C_mO_{12}$, in forms of oxides, carbonates or nitrates as starting materials; mixing the materials evenly; annealing; fully melting at a high temperature (more than 1,600° C.); quickly cooling to obtain a transparent glass; annealing at a low temperature of 700-950° C. for 1-10 h to remove an internal stress of the glass;

(2) putting the glass obtained in step (1) into a high-temperature furnace; holding at 1,000-1,200° C. for 0-10 h; raising the temperature to 1,400-1,500° C.; performing crystallization and densification sintering in air or vacuum; holding for 5-80 h, to obtain a fluorescent transparent ceramic with a certain linear transmittance; and (3) sequentially cutting, reducing and surface-polishing the fluorescent transparent ceramic obtained in step (2) to obtain a fluorescent transparent ceramic with a high quantum efficiency and an adjustable transmittance.

The method of the present invention treats the glass components to prepare a ceramic material with a high quantum efficiency and an adjustable transmittance, which can be used to prepare a high-power blue light-emitting diode (LED) or laser diode (LD) device.

In the chemical formula of $Ca_{3-x-y}Ce_xA_ySc_{2-z}B_zSi_{3-m}C_mO_{12}$, A is at least one, and may be a mixture of two or more of the group consisting of Lu, Y, Gd, La and Na; B is at least one selected from the group consisting of Zr, Hf and Mg; C is at least one selected from the group consisting of Al and P; x, y, z and m satisfy $0.001 \leq x \leq 0.06$, $0 \leq y \leq 0.06$, $0 \leq z \leq 0.06$ and $0 \leq m \leq 0.3$, respectively.

In the chemical formula, except for P, the elements are preferably in the form of oxides and carbonates.

In the chemical formula, P is diammonium hydrogen phosphate or ammonium dihydrogen phosphate.

The green fluorescent transparent ceramic prepared by the present invention is used in high-power blue LED or LD-based solid-state lighting (SSL) and display.

The green fluorescent transparent ceramic prepared by the present invention can be packaged with a semiconductor SSL source to obtain a high-power green or white light device for lighting and display.

The semiconductor SSL source is an LED or LD with an emission wavelength of 420-480 nm. The present invention has the following beneficial effects:

The preparation method of the green fluorescent transparent ceramic provided by the present invention does not require special experimental conditions such as long time ball-milling, cold isostatic pressing, high vacuum, pressure-assisted hot sintering, and achieves simple synthesis and low cost. In addition, the green fluorescent transparent ceramic obtained by the present invention has high density, adjustable transmittance and high quantum efficiency, and can be packaged with a high-power blue LED or LD to prepare a high-power SSL device.

DETAILED DESCRIPTION OF THE EMBODIMENTS

The present invention is described in more detail below with reference to the accompanying drawings and specific examples.

EXAMPLES

Commercially available high-purity $CaCO_3$, $Na_2CO_3$, $SiO_2$, $ZrO_2$, $HfO_2$, $Al_2O_3$, $NH_4H_2PO_4$, $CeO_2$, $Sc_2O_3$, $Tb_4O_7$ (5N), $Gd_2O_3$(5N), $La_2O_3$, $Y_2O_3$ and $Lu_2O_3$ were used in the examples of the present invention.

Example 1

Preparation of $Ca_{2.999}Ce_{0.001}Sc_2Si_3O_{12}$ 3.0016 g of $CaCO_3$, 1.3791 g of $Sc_2O_3$, 1.8025 g of $SiO_2$ and 0.0017 g of $CeO_2$ were weighed according to a stoichiometric ratio and put into an agate mortar. 5 ml of alcohol was added to grind the materials for 30 min to obtain a mixed powder. The mixed powder was pressed into a sheet by a manual sheet press. The sheet was put into a high-temperature box furnace and held at 1,100° C. for 6 h. Then the sheet was cooled naturally. One twentieth of the sheet was cut and put into a gaseous suspension furnace provided with a dual-beam carbon dioxide laser. The sample was smelted in suspension by using high-purity oxygen as a carrier gas, and was kept in a molten state for about 30 s to obtain a melt. Then, the laser was cut off, and the melt was rapidly cooled to obtain a glass sphere with corresponding components. The obtained glass sphere was put into a high-temperature box furnace. The temperature was raised to 900° C. by 2° C./min, and the glass sphere was held at this temperature for 3 h to remove an internal stress. Then the temperature was raised to 1,050° C. by 3° C./min, and the glass sphere was held at this temperature for 2 h. Finally, the temperature was raised to 1,450° C. by 4° C./min to perform densification sintering under a normal pressure of 0.1 Mpa for 20 h. After natural cooling, a densified spherical fluorescent transparent ceramic was obtained, and the spherical fluorescent transparent ceramic was cut into a sheet. The fluorescent transparent ceramic sheet was put into a tube furnace, and held at 1,350° C. for 4 h under 5% of $H_2$/95% of $N_2$, so as to further improve the quantum efficiency of the phosphor. Finally, the fluorescent transparent ceramic sheet was surface-polished to obtain a fluorescent transparent ceramic represented by $Ca_{2.999}Ce_{0.001}Sc_2Si_3O_{12}$. This sample had an internal quantum efficiency (IQE) of 94% and a linear transmittance of 3% at 600 nm at a thickness 0.5 mm. The excitation and emission spectra of the sample prepared in this example were similar to those a sample prepared in Example 2.

Example 2

Preparation of $Ca_{2.994}Ce_{0.006}Sc_2Si_3O_{12}$

Except that the densification sintering time was set to 40 h, the other preparation steps were the same as in Example 1. The IQE of the sample prepared in this example was 93%.

Figure 1:
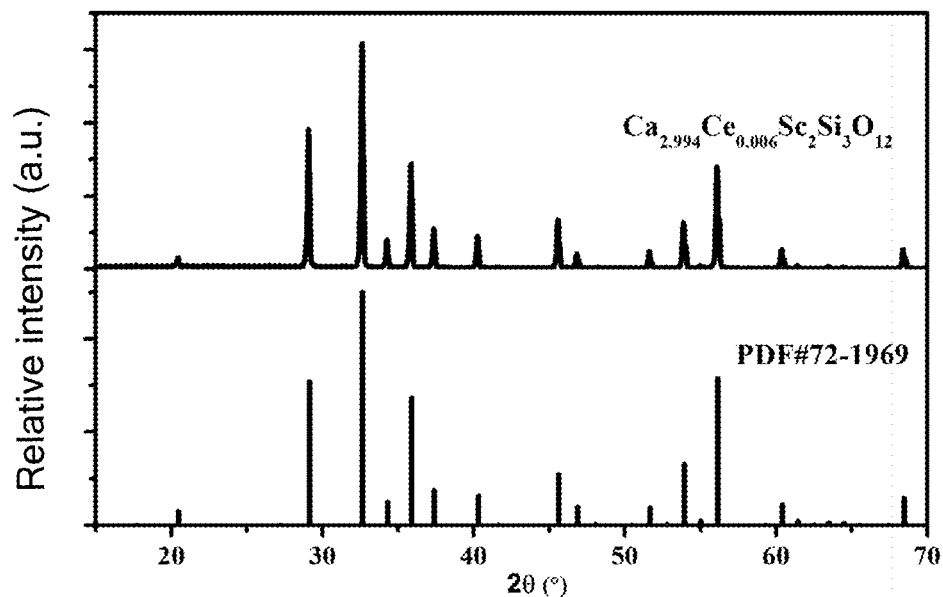
FIG. 1 shows an X-ray diffraction (XRD) spectrum of a green fluorescent transparent ceramic according to Example 2 of the present invention.

FIG. 1 shows an X-ray diffraction (XRD) spectrum of the sample prepared in this example. It can be seen from FIG. 1 that the fluorescent transparent ceramic did not have any impurity phases except for a cubic crystal phase of a garnet structure.

Figure 2:
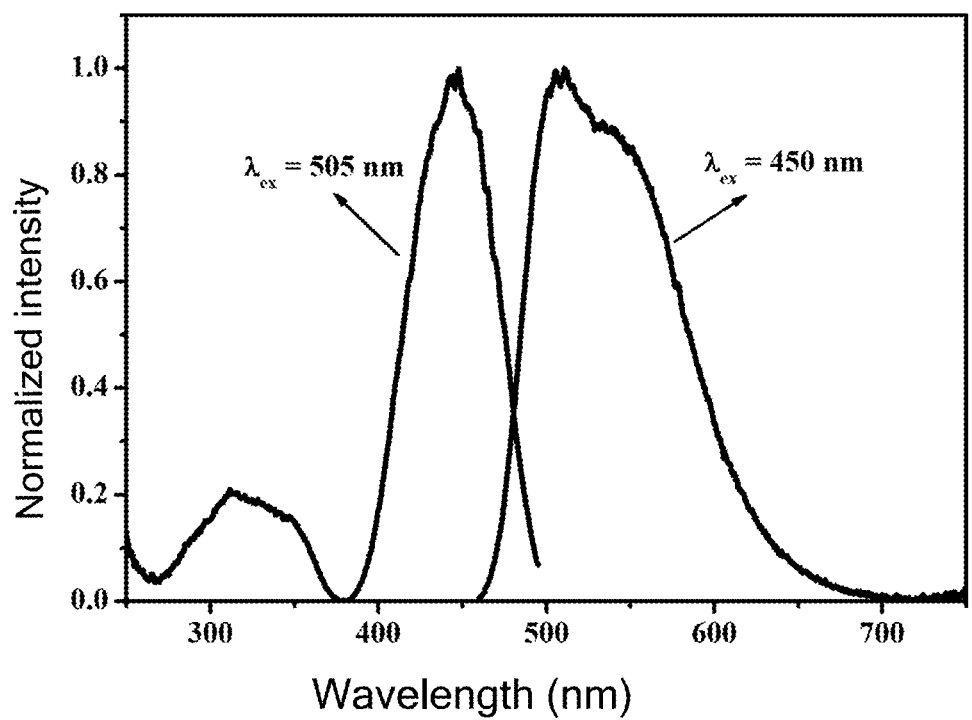
FIG. 2 shows excitation and emission spectra of the green fluorescent transparent ceramic according to Example 2 of the present invention.

FIG. 2 shows excitation and emission spectra of a sample prepared in this example. It can be seen from FIG. 2 that the fluorescent ceramic emitted broadband green light with a peak of 505 nm under the excitation of blue light at 420-480 nm.

Figure 3:
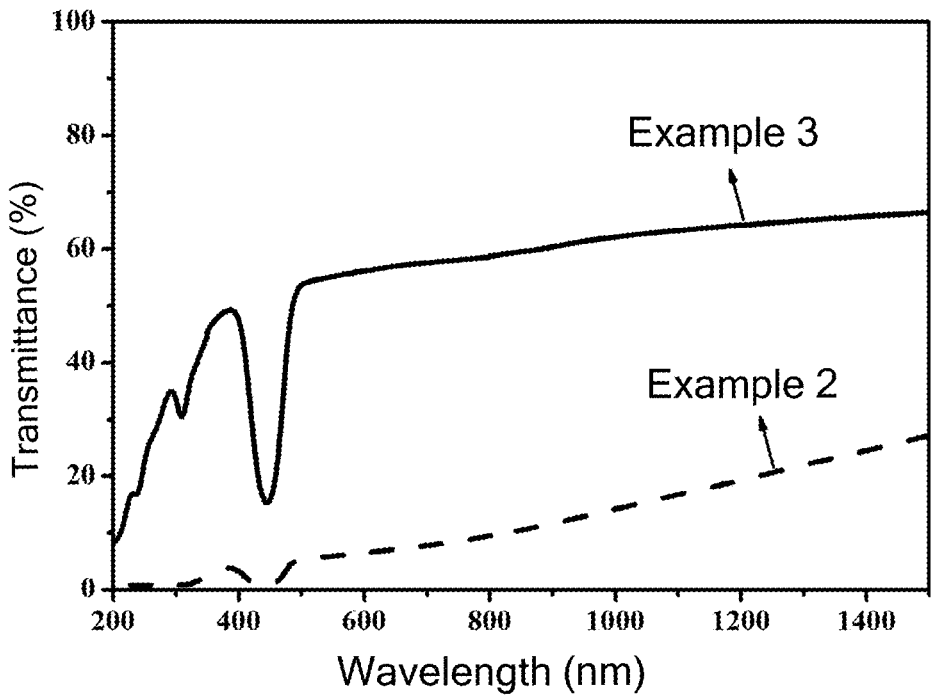
FIG. 3 shows transmittance spectra of green fluorescent transparent ceramics according to Example 2 and Example 3 of the present invention.

It can be seen from a linear transmittance spectrum in FIG. 3 that the sample prepared in this example had a linear transmittance of 7% at 600 nm at a thickness of 0.5 mm, and had strong absorption of blue light near 450 nm.

Figure 4:
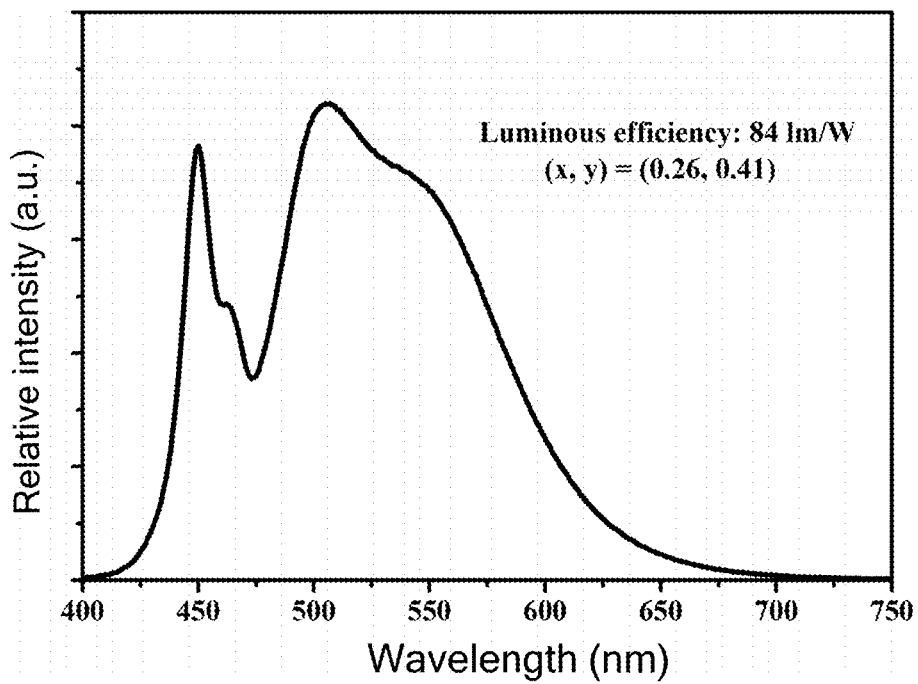
FIG. 4 shows an electroluminescence spectrum and parameters of a light-emitting diode (LED) device packaged with the fluorescent transparent ceramic and a 450 nm blue LED according to Example 2 of the present invention.

FIG. 4 shows a spectrum and parameters of an LED device packaged with a sample of this example with a thickness of 0.3 mm and a 450 nm blue LED. The device had a luminous efficiency (LE) of 84 lm/W at 20 mA, with a spectrum covering a blue to green region, and it could be used in LED-based lighting and display.

Figure 5:
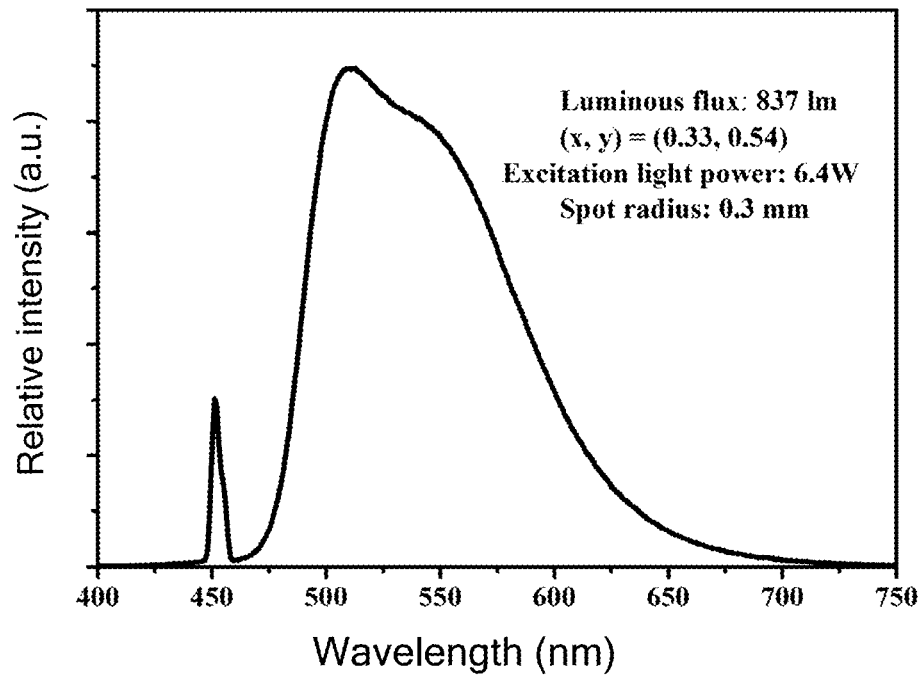
FIG. 5 shows a spectrum and parameters of a white high-power light-emitting device packaged with the fluorescent transparent ceramic and a 450 nm blue laser diode (LD) according to Example 2 of the present invention.
Figure 6:
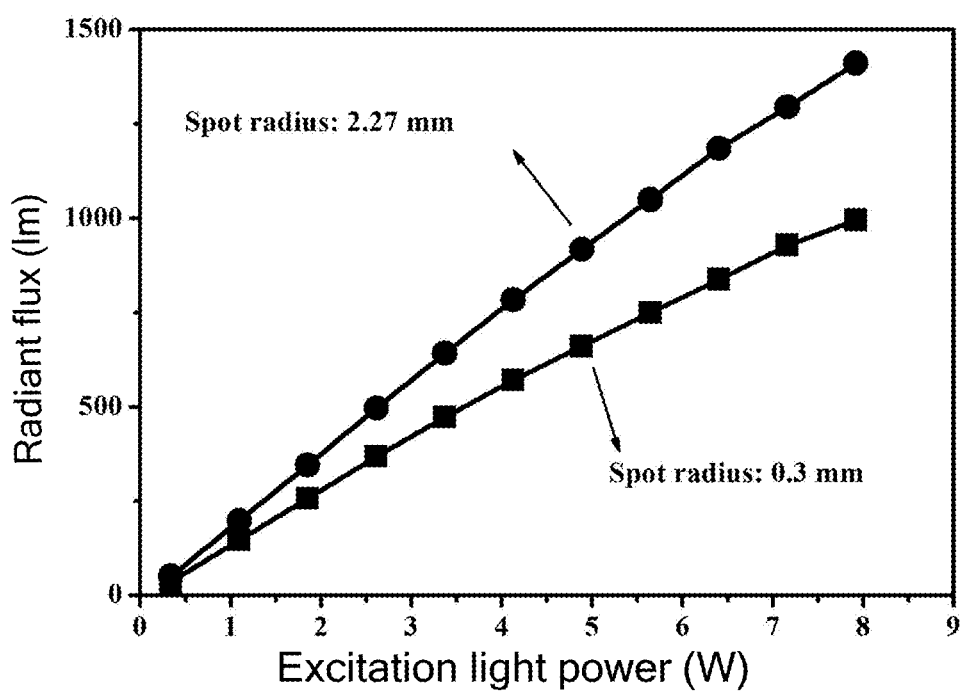
FIG. 6 shows a variation of a luminous flux of the high-power light-emitting device packaged with the fluorescent transparent ceramic and the 450 nm blue LD as a function of an excitation light power according to Example 2 of the present invention.

FIG. 5 shows a spectrum and parameters of a high-power light-emitting device packaged with a sample of this example with a thickness of 0.7 mm and a 450 nm blue LED. Under an excitation light power of 6.4 W, a laser spot radius was only 0.3 mm, and a luminous flux of up to 837 lm could be obtained. FIG. 6 shows a variation of the luminous flux of the device with the excitation light power. It can be seen that the luminous flux was not saturated even at the excitation light power density as high as 28 W/mm$^2$, the maximum luminous flux was 1,410 lm, and the maximum light-to-light conversion efficiency was 178 lm/W. Therefore, this device could be used in high-power LED or LD-based lighting and display.

Figure 7:
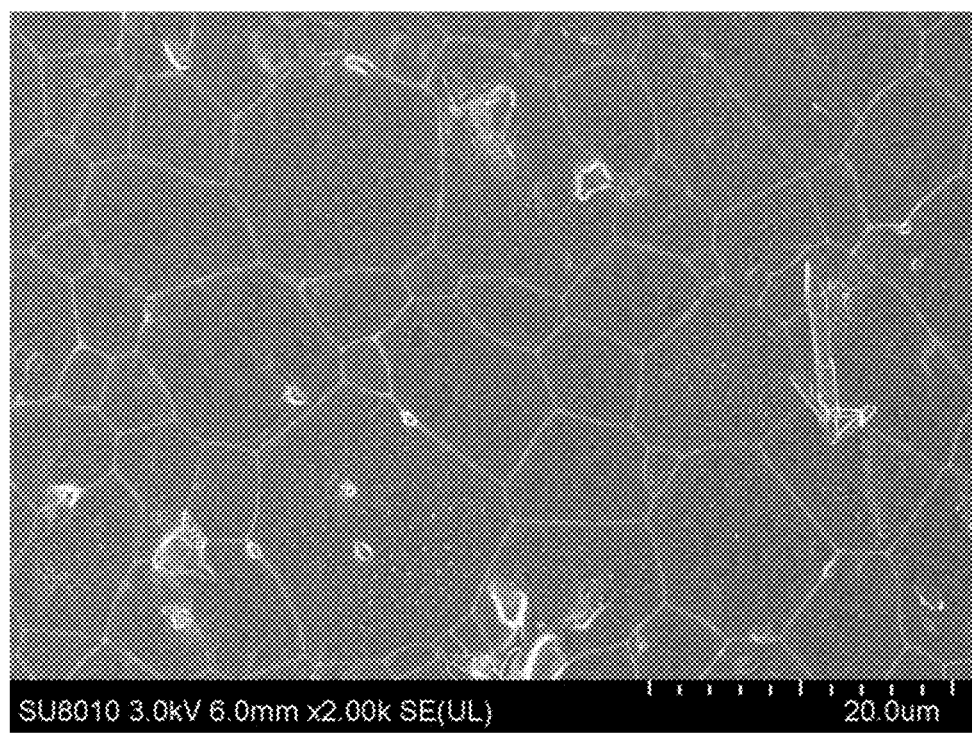
FIG. 7 shows a scanning electron microscope (SEM) image of the fluorescent transparent ceramic according to Example 2 of the present invention.

FIG. 7 shows a scanning electron microscope (SEM) image of a sample prepared in this example after surface-polishing and thermal etching at 1,350° C. for 2 h. It can be seen from the figure that the sample had very few pores and had a density as high as 99.5%.

Example 3

Preparation of $Ca_{2.98}Ce_{0.01}Gd_{0.01}Sc_2Si_3O_{12}$

Except that a high-temperature vacuum furnace was used for sintering and the vacuum pressure was set to 0.1 Pa, the other preparation steps were the same as in Example 2. This sample had an IQE of 91% and a linear transmittance of 56% at 600 nm at a thickness 0.5 mm (FIG. 3). The excitation and emission spectra of the sample prepared in this example were similar to those of a sample prepared in Example 2.

Examples 4 to 23: The corresponding raw materials were weighed according to the chemical composition and stoichiometric ratio of each example shown in Table 1. The densification temperature was 1,450° C., the holding time and the vacuum pressure are shown in Table 1, and the other steps are the same as in the examples described above. In Table 1, the transmittance refers to a linear transmittance of the sample at 600 nm and at a thickness of 0.5 mm.

TABLE 1

Examples 1 to 23

| Example | Chemical formula | Densification time | Vacuum pressure | Transmittance |
|---|---|---|---|---|
| 1 | $Ca_{2.999}Ce_{0.001}Sc_2Si_3O_{12}$ | 20 h | 0.1 Mpa | 3% |
| 2 | $Ca_{2.994}Ce_{0.006}Sc_2Si_3O_{12}$ | 40 h | 0.1 Mpa | 7% |
| 3 | $Ca_{2.98}Ce_{0.01}Gd_{0.01}Sc_2Si_3O_{12}$ | 40 h | 0.1 Pa | 56% |
| 4 | $Ca_{2.98}Ce_{0.01}La_{0.01}Sc_2Si_3O_{12}$ | 40 h | 0.1 Mpa | 26% |
| 5 | $Ca_{2.98}Ce_{0.01}Tb_{0.01}Sc_2Si_3O_{12}$ | 40 h | 0.1 Mpa | 23% |
| 6 | $Ca_{2.98}Ce_{0.01}Y_{0.01}Sc_2Si_3O_{12}$ | 40 h | 0.1 Mpa | 15% |
| 7 | $Ca_{2.98}Ce_{0.01}Lu_{0.01}Sc_2Si_3O_{12}$ | 40 h | 0.1 Mpa | 5% |
| 8 | $Ca_{2.98}Ce_{0.01}Na_{0.01}Sc_2Si_3O_{12}$ | 40 h | 0.1 Mpa | 23% |
| 9 | $Ca_{2.994}Ce_{0.006}Sc_{1.98}Zr_{0.02}Si_3O_{12}$ | 40 h | 0.1 Mpa | 30% |
| 10 | $Ca_{2.994}Ce_{0.006}Sc_{1.98}Hf_{0.02}Si_3O_{12}$ | 40 h | 0.1 Mpa | 26% |
| 11 | $Ca_{2.994}Ce_{0.006}Sc_{1.98}Mg_{0.02}Si_3O_{12}$ | 40 h | 0.1 Mpa | 20% |
| 12 | $Ca_{2.994}Ce_{0.006}Sc_2Si_{2.97}Al_{0.03}O_{12}$ | 40 h | 0.1 Mpa | 15% |
| 13 | $Ca_{2.994}Ce_{0.006}Sc_2Si_{2.97}P_{0.03}O_{12}$ | 40 h | 0.1 Mpa | 30% |
| 14 | $Ca_{2.994}Ce_{0.006}Sc_{1.99}Hf_{0.01}Si_{2.99}P_{0.01}O_{12}$ | 40 h | 0.1 Mpa | 20% |
| 15 | $Ca_{2.994}Ce_{0.006}Sc_{1.99}Zr_{0.01}Si_{2.99}P_{0.01}O_{12}$ | 40 h | 0.1 Mpa | 22% |
| 16 | $Ca_{2.994}Ce_{0.006}Sc_{1.99}Zr_{0.01}Si_{2.99}Al_{0.01}O_{12}$ | 40 h | 0.1 Mpa | 18% |
| 17 | $Ca_{2.984}Ce_{0.006}Gd_{0.01}Sc_{1.99}Zr_{0.01}Si_{2.99}Al_{0.01}O_{12}$ | 40 h | 0.1 Mpa | 21% |
| 18 | $Ca_{2.988}Ce_{0.006}Na_{0.006}Sc_{1.99}Zr_{0.01}Si_3O_{12}$ | 40 h | 0.1 Mpa | 28% |
| 19 | $Ca_{2.984}Ce_{0.006}Gd_{0.01}Sc_{1.99}Zr_{0.01}Si_{2.99}Al_{0.01}O_{12}$ | 40 h | 0.1 Mpa | 20% |
| 20 | $Ca_{2.984}Ce_{0.006}Na_{0.01}Sc_{1.99}Zr_{0.01}Si_{2.99}Al_{0.01}O_{12}$ | 40 h | 0.1 Mpa | 16% |
| 21 | $Ca_{2.98}Ce_{0.01}Gd_{0.01}Sc_2Si_3O_{12}$ | 5 h | 0.1 Mpa | 1% |
| 22 | $Ca_{2.98}Ce_{0.01}Gd_{0.01}Sc_2Si_3O_{12}$ | 80 h | 0.1 Mpa | 42% |
| 23 | $Ca_{2.98}Ce_{0.01}Gd_{0.01}Sc_2Si_3O_{12}$ | 40 h | 0.1 Mpa | 30% |

Overall, the present invention adjusts the light transmittance through different process conditions including element ratios and holding and sintering conditions, thereby appropriately prolonging the sintering and holding time, and achieving higher transmittance. The light transmittance of the present invention can reach up to 56%, achieving an extremely high density.

Obviously, the above examples are merely intended to clearly describe the present invention, and other changes or alterations may be made on the basis of the above description. Therefore, obvious changes or alterations made accordingly should still fall within the protection scope of the present invention. The preparation of the glass in the examples of the present invention adopts a gaseous suspension furnace method. However, the preparation of the glass is not limited to this method, and other methods that can fully melt the raw materials and quickly cool may also obtain the glass of the present invention. The raw materials used in the examples of the present invention may also be other compounds that include corresponding elements but do not introduce foreign impurities.

What is claimed is:

1. A green fluorescent transparent ceramic, wherein the green fluorescent transparent ceramic is prepared according to a stoichiometric ratio of elements present in a chemical formula of $Ca_{3-x-y}Ce_xA_ySc_{2-z}B_zSi_{3-m}C_mO_{12}$, wherein A is at least one selected from the group consisting of Lu, Y, Gd, La and Na; B is at least one selected from the group consisting of Zr, Hf and Mg; C is at least one selected from the group consisting of Al and P; x, y, z and m satisfy $0.001 \leq x \leq 0.06$, $0 \leq y \leq 0.06$, $0 \leq z \leq 0.06$ and $0 \leq m \leq 0.3$, respectively.

2. A preparation method of a green fluorescent transparent ceramic, comprising the following steps:
(1) weighing, according to a stoichiometric ratio, elements present in a chemical formula of $Ca_{3-x-y}Ce_xA_ySc_{2-z}B_zSi_{3-m}C_mO_{12}$, in forms of oxides, carbonates or nitrates as starting materials; mixing the starting materials evenly to obtain a mixture; annealing the mixture; fully melting the mixture at a first temperature; cooling the mixture to obtain a transparent glass; annealing the transparent glass at a second temperature of 700-950° ° C.for 1-10 h to remove an internal stress of the transparent glass;
(2) putting the transparent glass obtained in step (1) into a high-temperature furnace; holding the transparent glass at a third temperature of 1,000-1,200° ° C.for 0-10 h; raising the third temperature to a fourth temperature of 1,400-1,500° C.; performing a crystallization and a densification sintering on the transparent glass in air or vacuum to obtain a product; holding the product at the fourth temperature for 5-80 h, to obtain a fluorescent transparent ceramic; and (3) sequentially cutting, reducing and surface-polishing the fluorescent transparent ceramic obtained in step (2) to obtain the fluorescent transparent ceramic with a high quantum efficiency and an adjustable transmittance.

3. The preparation method of the green fluorescent transparent ceramic according to claim 2, wherein
in the chemical formula of $Ca_{3-x-y}Ce_xA_ySc_{2-z}B_zSi_{3-m}C_mO_{12}$, A is at least one selected from the group consisting of Lu, Y, Gd, La and Na; B is at least one selected from the group consisting of Zr, Hf and Mg; C is at least one selected from the group consisting of Al and P; x, y, z and m satisfy $0.001 \leq x \leq 0.06$, $0 \leq y \leq 0.06$, $0 \leq z \leq 0.06$ and $0 \leq m \leq 0.3$, respectively.

4. The preparation method of the green fluorescent transparent ceramic according to claim 3, wherein in the chemical formula, except for the P, the elements are in the form of the oxides and the carbonates.

5. The preparation method of the green fluorescent transparent ceramic according to claim 3, wherein in the chemical formula, the P is diammonium hydrogen phosphate or ammonium dihydrogen phosphate.

6. A green fluorescent transparent ceramic, wherein the green fluorescent transparent ceramic is prepared by the preparation method according to claim 2.

7. A solid-state lighting (SSL) device based on a high-power blue light-emitting diode (LED) or a laser diode (LD) comprising the green fluorescent transparent ceramic according to claim 6.

8. The green fluorescent transparent ceramic according to claim 6, wherein
in the chemical formula of $Ca_{3-x-y}Ce_xA_ySc_{2-z}B_zSi_{3-m}C_mO_{12}$, A is at least one selected from the group consisting of Lu, Y, Gd, La and Na; B is at least one selected from the group consisting of Zr, Hf and Mg; C is at least one selected from the group consisting of Al and P; x, y, z and m satisfy $0.001 \leq x \leq 0.06$, $0 \leq y \leq 0.06$, $0 \leq z \leq 0.06$ and $0 \leq m \leq 0.3$, respectively.

9. The green fluorescent transparent ceramic according to claim 8, wherein in the chemical formula, except for the P, the elements are in the form of the oxides and the carbonates.

10. The green fluorescent transparent ceramic according to claim 8, wherein in the chemical formula, the P is diammonium hydrogen phosphate or ammonium dihydrogen phosphate.

* * * * *